United States Patent
Ohta (10) Patent No.: US 7,234,364 B2
(45) Date of Patent: Jun. 26, 2007

(54) ANGULAR RATE SENSOR HAVING CIRCUIT BOARD AND PACKAGE

(75) Inventor: Tameharu Ohta, Takahama (JP)

(73) Assignee: DENSO Corporation, Kariya (JP)

( * ) Notice: Subject to any disclaimer, the term of this patent is extended or adjusted under 35 U.S.C. 154(b) by 110 days.

(21) Appl. No.: 11/159,261

(22) Filed: Jun. 23, 2005

(65) Prior Publication Data

US 2006/0000294 A1   Jan. 5, 2006

(30) Foreign Application Priority Data

Jun. 30, 2004   (JP)   ............... 2004-193824

(51) Int. Cl.
*G01L 3/00*   (2006.01)

(52) U.S. Cl. ............... 73/862.08; 73/514.16; 73/514.24; 73/514.38

(58) Field of Classification Search ............ 73/862.08, 73/514.16, 514.24, 514.38
See application file for complete search history.

(56) References Cited

U.S. PATENT DOCUMENTS 5,901,046 A * 5/1999 Ohta et al. ................. 361/760

6,388,321 B1 * 5/2002 Hirai et al. ................. 257/737
2004/0187577 A1   9/2004 Higuchi et al.

FOREIGN PATENT DOCUMENTS

JP   A-2000-55667   2/2000

* cited by examiner

*Primary Examiner*—Edward Lefkowitz
*Assistant Examiner*—Freddie Kirkland, III
(74) *Attorney, Agent, or Firm*—Posz Law Group, PLC (57) ABSTRACT

An angular rate sensor includes: a circuit board; a package including an angular rate sensor chip and a connection terminal; and a conductive member. The angular rate sensor chip is accommodated in the package. The package is disposed on the circuit board through the conductive member. The package further includes a first electrode disposed on a bottom of the package, the first electrode connecting to the connection terminal. The circuit board includes a second electrode disposed on a top of the circuit board. The angular rate sensor chip in the package is electrically connected to the circuit board through the connection terminal, the first and the second electrodes and the conductive member. The circuit board and the package are electrically and elastically connected by the conductive member.

18 Claims, 6 Drawing Sheets

ANGULAR RATE SENSOR HAVING CIRCUIT BOARD AND PACKAGE

CROSS REFERENCE TO RELATED APPLICATION

This application is based on Japanese Patent Application No. 2004-193824 filed on Jun. 30, 2004, the disclosure of which is incorporated herein by reference.

FIELD OF THE INVENTION

The present invention relates to an angular rate sensor having a circuit board and a package.

BACKGROUND OF THE INVENTION

An angular rate sensor detects a displacement caused by a Coriolis force, and then, the sensor converts the displacement to an electronic signal. Therefore, the sensor may output error caused by disturbance vibration. Therefore, vibration proof construction is necessitated for the sensor to reduce the disturbance vibration. In Japanese Patent Application Publication No. 2000-55667, the sensor has a construction, in which a substrate with a vibrator is fixed on a fixation member through a vibration proof rubber.

However, the construction for the vibration proof is complicated, so that an electric connection construction is also complicated.

SUMMARY OF THE INVENTION

In view of the above-described problem, it is an object of the present invention to provide an angular rate sensor having a circuit board and a package. The sensor has vibration proof with a simple construction.

An angular rate sensor includes: a circuit board; a package including an angular rate sensor and a connection terminal; and a conductive member. The angular rate sensor is accommodated in the package. The package is disposed on the circuit board through the conductive member. The package further includes a first electrode disposed on a bottom of the package, the first electrode connecting to the connection terminal. The circuit board includes a second electrode disposed on a top of the circuit board. The angular rate sensor in the package is electrically connected to the circuit board through the connection terminal, the first and the second electrodes and the conductive member. The circuit board and the package are electrically and elastically connected by the conductive member.

The above sensor has vibration proof structure provided by the conductive member. Further, the vibration proof structure is simply formed by the conductive member, and further, the conductive member electrically connects the package and the circuit board.

Preferably, the conductive member includes a plurality of conductive beads and a resin adhesive member. The conductive beads are disposed in the resin adhesive member. The resin adhesive member is capable of connecting the package and the circuit board elastically. The conductive beads are capable of connecting the package and the circuit board electrically.

Preferably, the conductive member includes an anisotropic conductive elastomeric member, and the elastoremic member is a sheet and has a conductive direction parallel to a direction between the circuit board and the package.

Preferably, the sensor further includes: force applying means for applying a force to the package so that the bottom of the package is pressed to the top of the circuit board through the conductive member.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
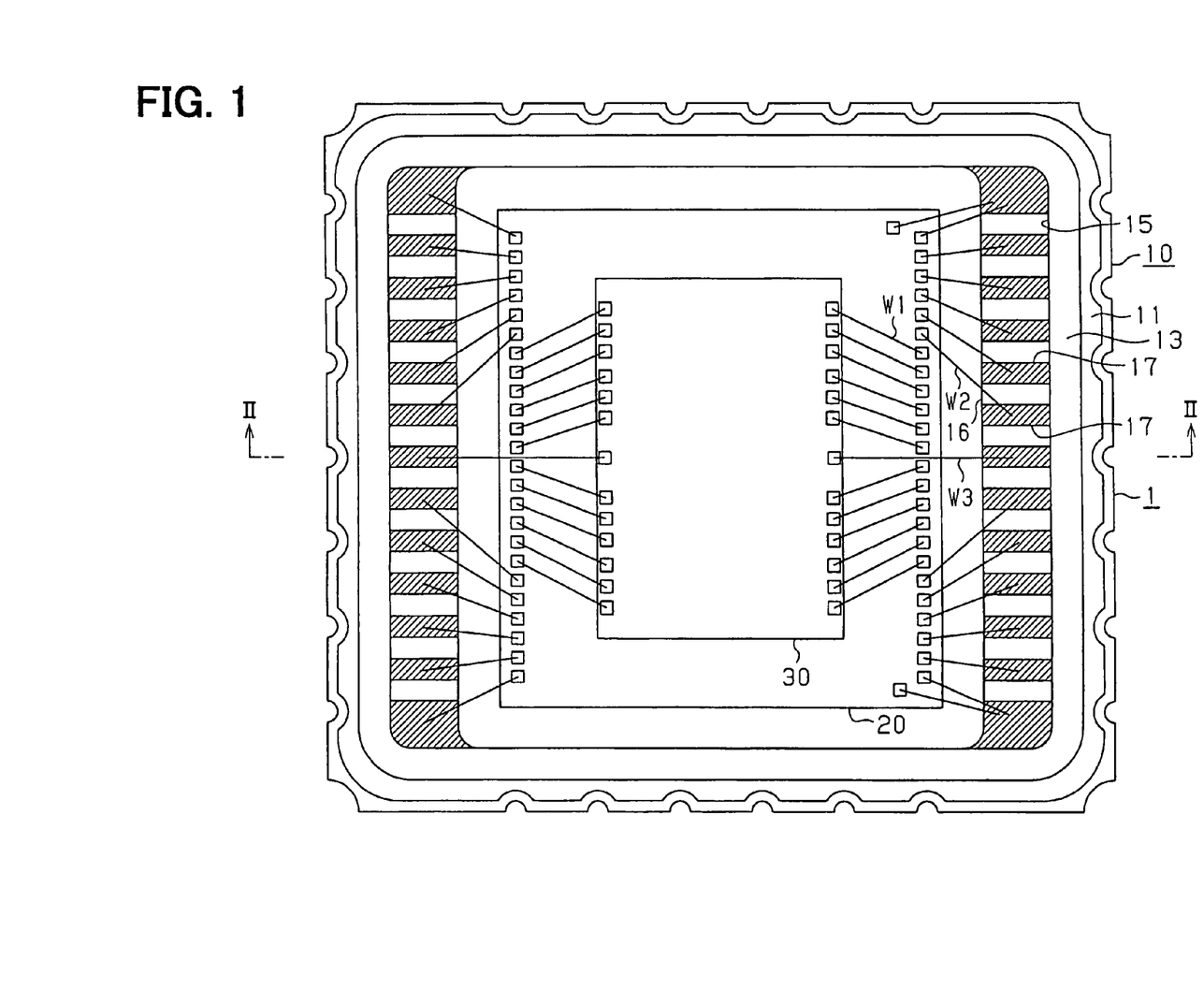
FIG. 1 is a plan view showing an angular rate sensor according to a first embodiment of the present invention.
Figure 2:
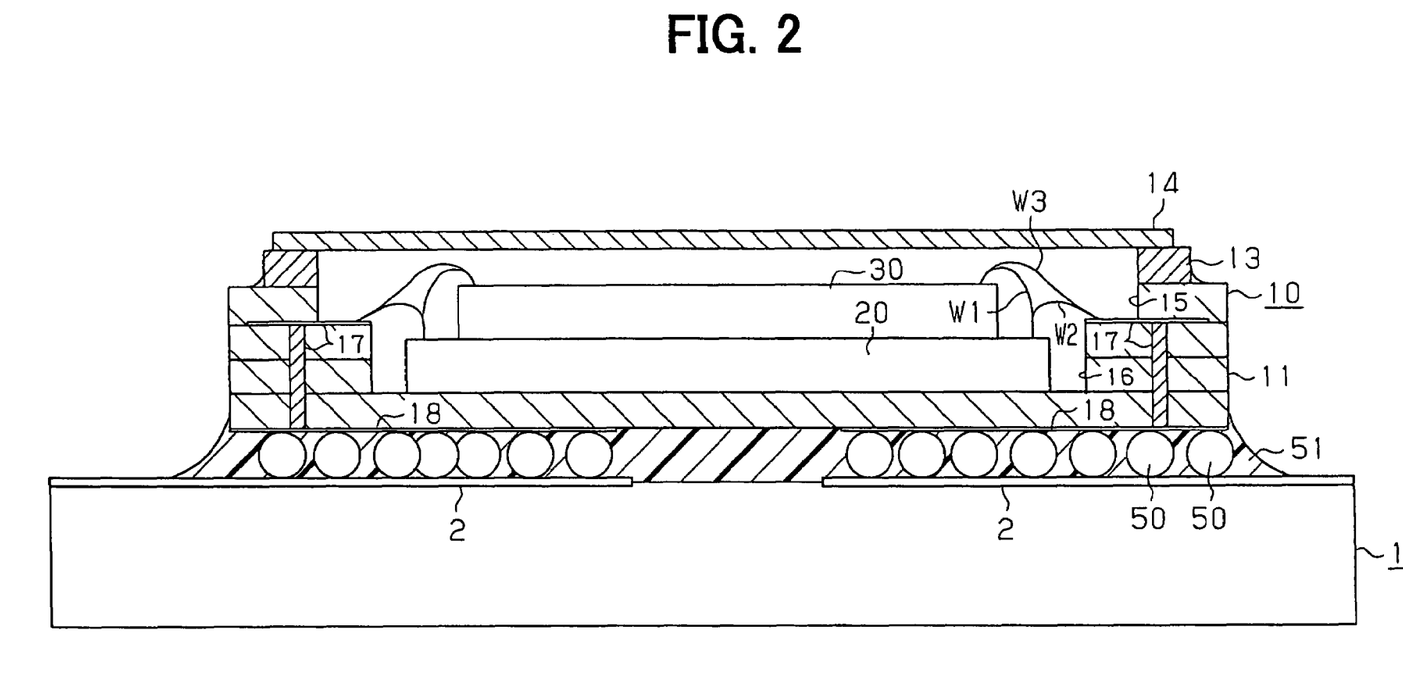
FIG. 2 is a cross sectional view showing the sensor taken along line II-II in FIG. 1.

An angular rate sensor according to a first embodiment of the present invention is shown in FIGS. 1 and 2. The sensor includes a sensor package 10. As shown in FIG. 2, the package 10 is composed of a base 11 made of ceramic, a seal ring 13 and a metallic lid 14. The seal ring 13 is brazed at a metallized portion of the ceramic base 11. The metallic lid 14 seals inner parts. FIG. 1 shows the sensor without the metallic lid 14.

The sensor package 10 is mounted on a circuit board 1. The base 11 of the sensor package 10 has ceramic multiple-layered structure. An upper concavity 15 is formed on an upper portion of the package 10. A lower concavity 16 is formed on a lower portion of the package 10. Specifically, the lower concavity 16 is disposed under the bottom of the upper concavity 15. The seal ring 13 is bonded to the top of the base 11 so that the seal ring 13 seals the base 11. The metallic lid 14 is bonded to the base 11 through the seal ring 13 so that the metallic lid 14 with the seal ring 13 seals the base 11. Specifically, the metallic lid 14 covers an opening portion of the seal ring 13, i.e., the opening portion of the upper concavity 15. Multiple terminals 17 are formed in the base 11. The terminal 17 is formed as an inner wiring when the base 11 having the multiple-layered structure is formed. The terminal 17 works for outputting a signal to an external circuit. One end of the terminals 17 is exposed on the bottom of the upper concavity 15. Another end of the terminals 17 extends toward the lower surface of the package 10.

A signal processor chip 20 is disposed on the bottom of the lower concavity 16 in the base 11. An angular rate sensor chip 30 is bonded to the signal processor chip 20. The angular rate sensor chip 30 includes an angular rate detection portion, which is a vibration type angular rate sensor.

Figure 3:
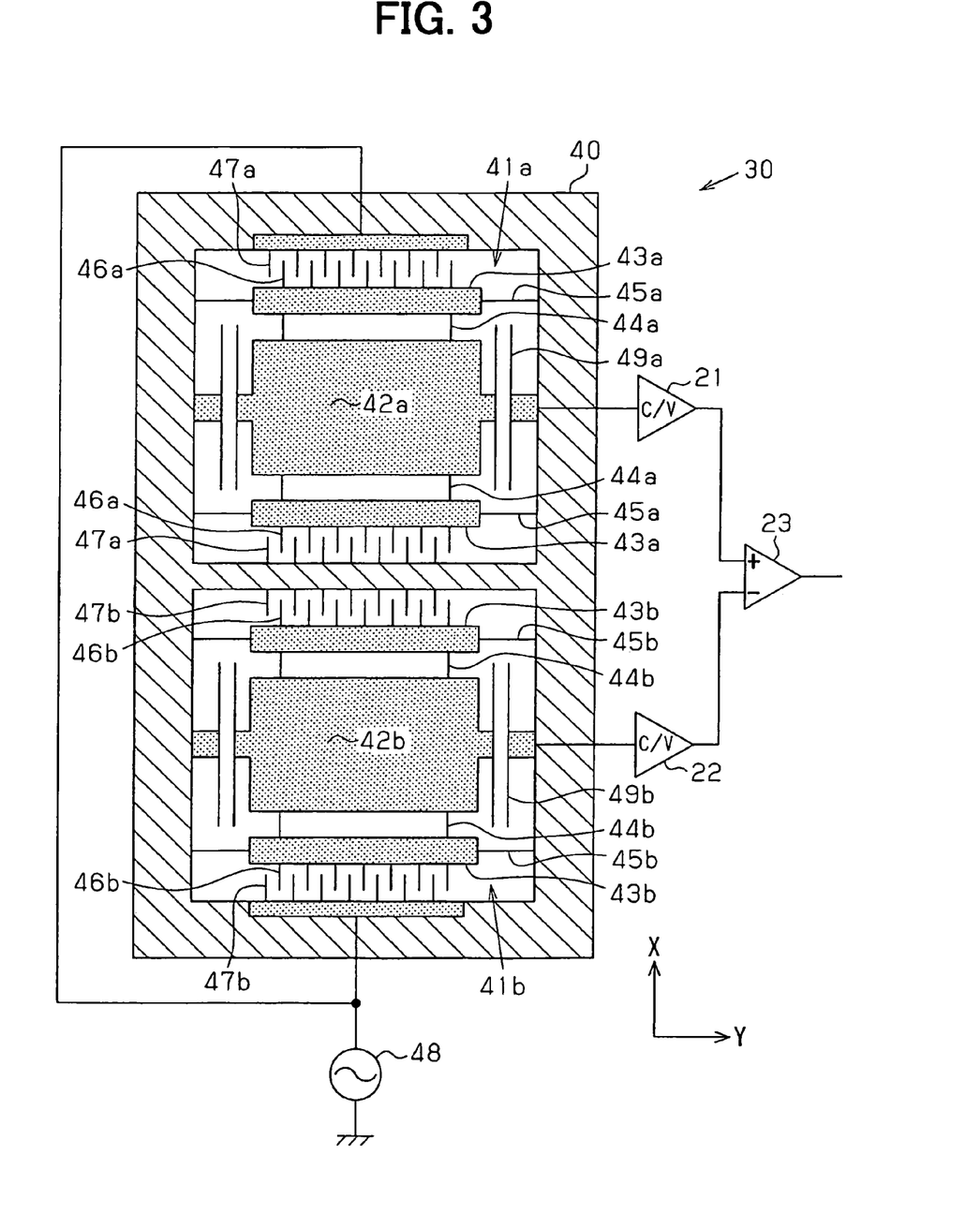
FIG. 3 is a schematic view showing an angular rate sensor chip and a circuit diagram of the chip, according to the first embodiment.

FIG. 3 shows the angular rate sensor chip 30. A direction x represents a vibration direction, and a direction Y represents an angular rate detection direction. The vibration direction X is perpendicular to the angular rate detection direction Y. The sensor chip 30 includes a rim 40, and a pair of vibrators 41a, 41b. The two vibrators 41a, 41b are disposed inside of the rim 40. Each vibrator 41a, 41b includes a weight portion 42a, 42b and a driving frame 43a, 43b. The weight portion 42a, 42b is connected to and supported by the driving frame 43a, 43b through a beam 44a, 44b. Further, the driving frame 43a, 43b is supported by the rim 40 through a beam 45a, 45b. Both of the weight portion 42a, 42b and the driving frame 43a, 43b are capable of vibrating in the vibration direction X through the beams 44a, 44b, 45a, 45b. This vibration is an excitation vibration. Further, the weight portion 42a, 42b is capable of vibrating in the angular rate detection direction Y.

The driving frame 43a, 43b includes a movable electrode 46a, 46b having a comb-teeth shape. The rim 40 includes a fixed electrode 47a, 47b. The fixed electrode 47a, 47b faces the movable electrode 46a, 46b. A driving unit 48 generates a driving voltage having a predetermined frequency, and applies the driving voltage between the fixed electrode 47a, 47b and the movable electrode 46a, 46b. Thus, the driving frame 43a, 43b and the weight portion 42a, 42b are vibrated in the vibration direction X. At this time, the driving frame 43a with the weight portion 42a is vibrated in an opposite phase of the vibration of the driving frame 43b with the weight portion 42b.

When the weight portions 42a, 42b with the driving frames 43a, 43b are vibrated with the excitation vibration, the motions of the weight portions 42a, 42b in the angular rate detection direction Y are detected by capacitors 49a, 49b. Specifically, when the Coriolis force is applied to the sensor chip 30, two angular rate vibration components in the angular rate detection direction are generated. Each angular rate vibration component has amplitude corresponding to the angular rate, and the components have reverse phases. The angular rate detection directions are measured as capacitance change of the capacitor 49a, 49b. The capacitance change of the capacitor 49a, 49b is converted to a voltage corresponding to the capacitance change in a C-V converter circuit 21, 22. Further, the difference of the angular rate vibration components, phases of which are reversed, is detected by a differential amplifier 23.

As shown in FIGS. 1 and 2, the angular rate sensor chip 30 is connected to the signal processor chip 20 through a bonding wire W1 electrically. Specifically, the angular rate detection signal of the angular rate sensor chip 30, i.e., the output signal of the differential amplifier 23, is introduced into the signal processor chip 20 through the bonding wire W1. Thus, the signal processor chip 20 processes the output signal. For example, the noise in the output signal is removed by the signal processor chip 20. The connection terminal 17 of the angular rate sensor package 10 is connected to the signal processor chip 20 through a bonding wire W2 electrically. The power supply voltage is supplied from the circuit board 1 to the signal processor chip 20 through the bonding wire W2 and the connection terminal 17. Further, the angular rate detection signal is outputted to the circuit board 1. Furthermore, the connection terminal 17 of the angular rate sensor package 10 is connected to the angular rate sensor chip 30 through a bonding wire W3 electrically. The chip 30 is grounded through the bonding wire W3 and the connection terminal 17.

Thus, the angular rate sensor package 10 with the angular rate sensor chip 30 accommodated in the package 10 is mounted on the circuit board 1. Further, the angular rate sensor chip 30 is electrically connected to the circuit board 1 through the connection terminal 17, which is disposed on the angular rate sensor package 10.

Multiple electrodes 18 are disposed on the bottom of the angular rate sensor package 10, i.e., the base 11 of the package 10. Each electrode 18 is connected to the connection terminal 17, which is embedded in the package 10 so that the connection terminal 17 works as a connector through the electrode 18 for an external circuit. Each electrode 18 is formed on the bottom of the package 10 by using a metallization method.

A conductive bead 50 as a conductive member having spherical shape is disposed between the electrode 2 disposed on the top of the circuit board 1 and the electrode 18 connecting to the connection terminal 17 disposed on the bottom of the package 10. The conductive bead 50 is made of conductive solid material. The bottom of the package 10 with having the conductive bead 50 is bonded to the top of the circuit board 1 through an adhesive member 51. The adhesive member 51 is made of resin adhesive having low elasticity. Specifically, the conductive bead 50 is mixed in the adhesive member 51 so that the adhesive member 51 with the conductive bead 50 has electric conductivity. The adhesive member 51 with the conductive bead 50 is applied on the electrode 2 of the top of the circuit board 1. Then, the package 10 is mounted on the circuit board 1. The adhesive member 51 is hardened so that the package 10 is bonded to the circuit board 1.

The conductive bead 50 is made of a metallic particle. The conductive bead 50 can be made of a plastic particle coated with metallic plating. The conductive bead 50 contacts the electrode 18 of the bottom of the package 10, and further, the bead 50 contacts the top of the circuit board 1. Thus, the electrode 2 of the top of the circuit board 1 is electrically connected to the electrode 18 through the conductive bead 50. Thus, circuit board 1 is connected with the bonding wires W2, W3 to the angular rate sensor chip 30 and the signal processor chip 20 electrically through the conductive bead 50, the connection terminal 17 and the electrode 18.

The adhesive member 51 connects the package 10 and the circuit board 1. In this case, the adhesive member 51 works as an elastomeric material having visco-elasticity. Thus, the adhesive member 51 provides vibration absorption. Specifically, the adhesive member 51 is low elastic adhesive so that the hardened adhesive member 51 works as a vibration proof member.

Here, a process for bonding between the circuit board 1 and the package 10 with the adhesive member 51 is described as follows. The resin adhesive with the conductive bead 50 mixed therein is applied to the circuit board 1. In this case, the resin adhesive can be applied to the board 1 by using a screen printed method. Thus, the resin adhesive is applied only on the electrode 2 selectively. Then, the package 10 is mounted on the circuit board 1. The resin adhesive is hardened so that the adhesive member 51 is formed. Thus, the package 1 is bonded to the circuit board 1. The resin adhesive is shrunk after the resin adhesive is hardened, so that the conductive bead 50 dispersed in the resin adhesive is sandwiched between the electrode 18 of the package 10 and the electrode 2 of the circuit board 1. Thus, the conductive bead 50 electrically connects the package 10 and the circuit board 1.

The vibration proof characteristic of the adhesive member 51 can be controlled by changing elasticity of the resin adhesive on the basis of the dimensions of the package 10. Thus, the elasticity of the resin adhesive is determined appropriately so that the adhesive member 51 has sufficient vibration proof. When the elasticity of he resin adhesive is controlled, the material itself of the resin adhesive can be changed to change the elasticity. The elasticity of the resin adhesive can be controlled by changing mixing ratio between the conductive bead 50 and the resin adhesive. Thus, the elasticity of the adhesive member 51 is controlled appropriately so that the vibration proof having a predetermined damping characteristic with a predetermined damping frequency is obtained.

Thus, the chip 30 in the package 10 is prevented from vibrating. The angular rate sensor having simple vibration proof construction is provided.

Figure 4:
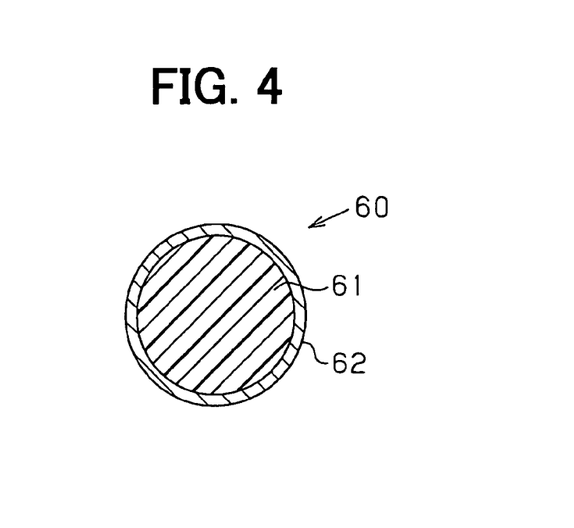
FIG. 4 is a cross sectional view showing an elastomeric member in the sensor, according to a first modification of the first embodiment.

Although the conductive bead 50 is used for connecting the package 10 and the circuit board 1 electrically, an elastomeric member 60 can be used for connecting the package 10 and the circuit board 1, as shown in FIG. 4. The elastomeric member 60 has a spherical shape and low elasticity. The elastomeric member 60 has a metallic coating film 62 and an elastomeric core 61. The elastomeric core 61 is made of elastomeric material. The metallic coating film 62 is deposited on the surface of the elactomeric core 61 by an evaporation method. In this case, the elastomeric member 60 provides vibration proof. Further, although the elasticity of the adhesive member 51 with the conductive bead 50 is affected by the mixing ratio between the adhesive member 51 and the conductive bead 50, the elasticity of the elastomeric member 60 is not affected by any condition when the elastomeric member 60 is used for connecting. Therefore, it is preferred that the elastomeric member 60 is used as the vibration proof member.

Figure 5:
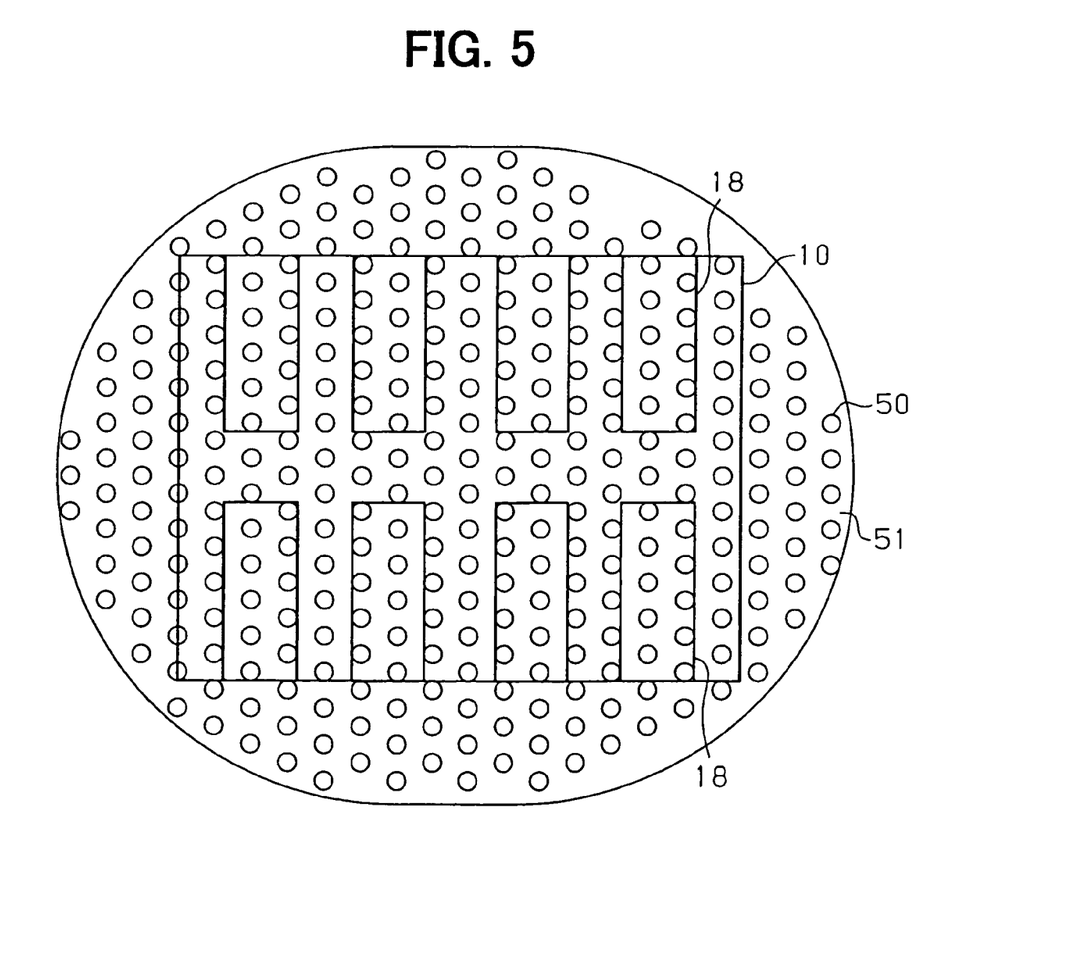
FIG. 5 is a plan view showing an electrode of the sensor, according to a second modification of the first embodiment.

Further, as shown in FIG. 5, dispersion of the conductive beads 50 is controlled so that each conductive bead 50 does not contact each other in a horizontal direction. Specifically, mixing ratio between the conductive beads 50 and the resin adhesive is controlled. For example, additional additive is added in the resin adhesive so that dispersion of the conductive beads 50 in the adhesive member 51 is homogenized. Thus, the conductive beads 50 is separated each other and disposed uniformly in the adhesive member 51 so that the conductive bead 50 electrically contacts the circuit board 1 and the package 10 in the vertical direction only. Therefore, even when the resin adhesive with the conductive beads 50 is applied to whole surface of the circuit board 1, the conductive bead 50 connects only the electrode 2 of the circuit board 1 and the electrode 18 of the package 10 electrically. Accordingly, electric contact in the vertical direction only between the electrodes 2, 18 is secured by the conductive beads 50. Thus, the electric connection between the circuit board 1 and the package 10 having vibration proof is provided.

Figure 6:
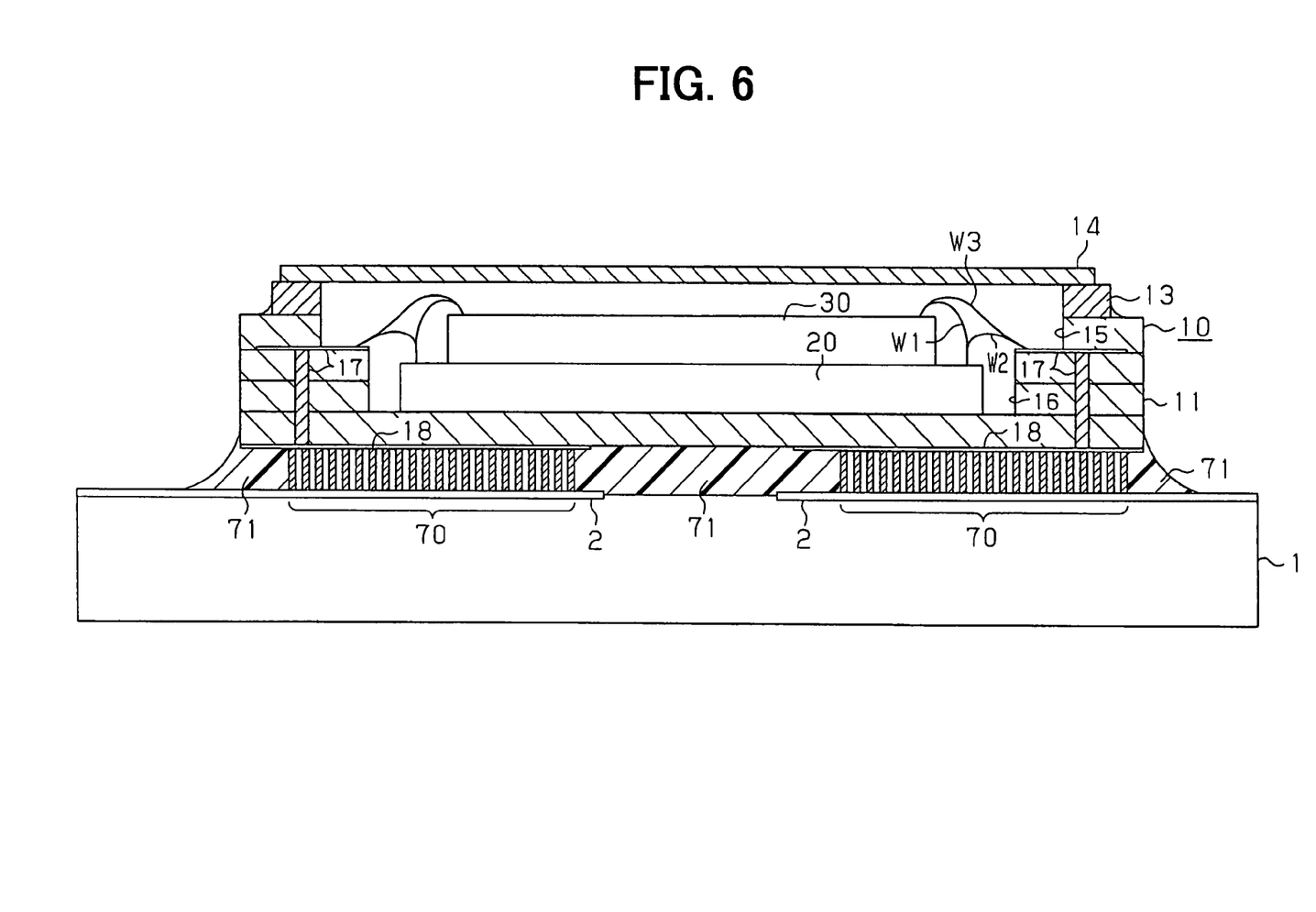
FIG. 6 is a cross sectional view showing an angular rate sensor according to a third modification of the first embodiment.

Furthermore, as shown in FIG. 6, instead of the elastomeric member 60, a conductive solid member 70 can be used for connecting the package 10 and the circuit board 1. The conductive solid member 70 is a sheet, and made of anisotropic conductive elastomer. The conductive solid member 70 has a conductive direction perpendicular to the surface of the circuit board 1. This is, the conductive direction is a thickness direction of the member 70. Specifically, the conductive solid member 70 is sandwiched between the package 10 and the circuit board 1. And an adhesive member 71 having low elasticity is applied around the conductive solid member 70. In this case, the electric contact between the package 10 and the circuit board 1 in the vertical direction, i.e., the thickness direction, is provided by the conductive solid member 70.

Second Embodiment

Figure 7:
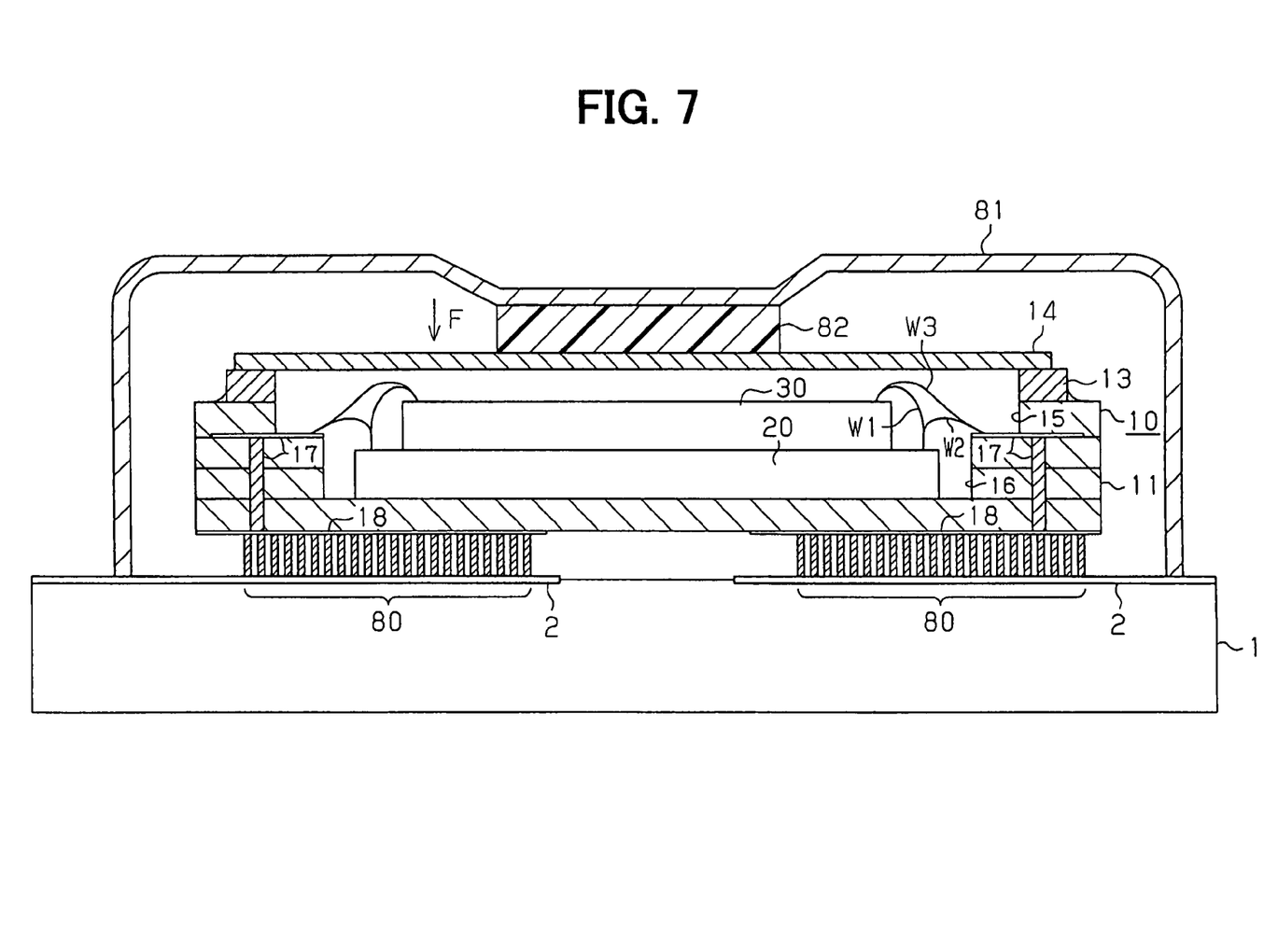
FIG. 7 is a cross sectional view showing an angular rate sensor according to a second embodiment of the present invention.

An angular rate sensor according to a second embodiment of the present invention is shown in FIG. 7. Multiple electrodes 18 are disposed on the bottom of the angular rate sensor package 10. Each electrode 18 is connected to the connection terminal 17 electrically. Therefore, the electrode 18 is disposed under the connection terminal 17. An anisotropic conductive elastomeric member 80 is disposed between the electrode 18 and the electrode disposed on the top of the circuit board 1. The anisotropic conductive elastomeric member 80 is a sheet, and has the conductive direction in the vertical direction. Further, a frame 81 as a holder extends from the circuit board 1 to the upper side of the package 10, which is an opposite side of the circuit board 1. Furthermore, the second elastomeric member 82 as an elastic member is disposed between the top of the package 10 and the frame 81. The frame 81 and the second elastomeric member 82 apply a bias force F to the package 10. Thus, the bottom of the package 10 is pressed to the top of the circuit board 1 by the frame 81 and the second elastomeric member 82 so that the package 10 and the circuit board are tightly connected.

The anisotropic conductive elastomeric member 80 connects the package 10 and the circuit board 1 electrically so that the electrode 18 on the bottom of the package 10 and the electrode 2 on the top of the circuit board 1 are connected with the elastomeric member 80. In this case, the elastomeric member 80 works as a vibration proof so that the angular rate sensor chip 30 accommodated in the package 10 is prevented from vibrating.

Since the elastomeric member 80 has the conductive direction in the vertical direction, the electric contact between the package 10 and the circuit board 1 only in the vertical direction is provided by the elastomeric member 80. Thus, the sensor according to the second embodiment provides electric connection between the package 10 and the circuit board 1 only in the vertical direction and vibration proof of the sensor chip 30 in the package 10.

Such changes and modifications are to be understood as being within the scope of the present invention as defined by the appended claims.

What is claimed is:

1. An angular rate sensor comprising:
 a circuit board;
 a package including an angular rate sensor chip and a connection terminal; and
 a conductive member, wherein
 the angular rate sensor chip is accommodated in the package,
 the package is disposed on the circuit board through the conductive member,
 the package further includes a first electrode disposed on a bottom of the package, the first electrode connecting to the connection terminal,
 the circuit board includes a second electrode disposed on a top of the circuit board,
 the angular rate sensor chip in the package is electrically connected to the circuit board through the connection terminal, the first and the second electrodes and the conductive member,
 the circuit board and the package are electrically and elastically connected by the conductive member,
 the conductive member includes an anisotropic conductive elastomeric member, and
 the anisotropic conductive elastomeric member contacts both of the first and second electrodes.

2. The sensor according to claim 1, wherein
the conductive member includes a plurality of conductive beads and a resin adhesive member,
the conductive beads are disposed in the resin adhesive member,
the resin adhesive member is capable of connecting the package and the circuit board elastically, and
the conductive beads are capable of connecting the package and the circuit board electrically.

3. The sensor according to claim 2, wherein
the conductive beads are dispersed in the resin adhesive member without contacting the beads together.

4. The sensor according to claim 1, wherein
the conductive member includes an elastomeric core and a conductive film,
the conductive film is disposed on a surface of the core, and
the core has a spherical shape.

5. The sensor according to claim 1, wherein
the elastomeric member is a sheet and has a conductive direction parallel to a direction between the circuit board and the package.

6. The sensor according to claim 1, further comprising:
force applying means for applying a force to the package so that the bottom of the package is pressed to the top of the circuit board through the conductive member.

7. The sensor according to claim 6, wherein
the elastomeric member is a sheet and has a conductive direction parallel to a direction between the circuit board and the package.

8. The sensor according to claim 6, wherein
the conductive member includes a plurality of conductive beads and a resin adhesive member,
the conductive beads are mixed in the resin adhesive member,
the resin adhesive member is capable of connecting the package and the circuit board elastically, and
the conductive beads are capable of connecting the package and the circuit board electrically.

9. The sensor according to claim 1, wherein
the conductive member is uniformly spaced between the package and the circuit board.

10. An angular rate sensor comprising:
a circuit board;
a package including an angular rate sensor chip and a connection terminal; and
a conductive member, wherein
the angular rate sensor chip is accommodated in the package,
the package is disposed on the circuit board through the conductive member,
the package further includes a first electrode disposed on a bottom of the package, the first electrode connecting to the connection terminal,
the circuit board includes a second electrode disposed on a top of the circuit board,
the angular rate sensor chip in the package is electrically connected to the circuit board through the connection terminal, the first and the second electrodes and the conductive member,
the circuit board and the package are electrically and elastically connected by the conductive member,
the conductive member includes an anisotropic conductive elastomeric solid member, and
the anisotropic conductive elastomeric solid member contacts both of the first and second electrodes.

11. The sensor according to claim 10, wherein
the conductive member is homogeneously disposed between the package and the circuit board.

12. An angular rate sensor comprising:
a circuit board;
a package including an angular rate sensor chip and a connection terminal; and
a conductive member, wherein
the angular rate sensor chip is accommodated in the package,
the package is disposed on the circuit board through the conductive member,
the package further includes a first electrode disposed on a bottom of the package, the first electrode connecting to the connection terminal,
the circuit board includes a second electrode disposed on a top of the circuit board,
the angular rate sensor chip in the package is electrically connected to the circuit board through the connection terminal, the first and the second electrodes and the conductive member,
the circuit board and the package are electrically and elastically connected by the conductive member,
the conductive member includes a plurality of conductive beads, and
the plurality of conductive beads are dispersed between the package and the circuit board.

13. The sensor according to claim 12, wherein
the conductive member further includes a resin adhesive member,
the conductive beads are disposed in the resin adhesive member,
the resin adhesive member is capable of elastically connecting the package and the circuit board, and
the conductive beads are capable of electrically connecting the package and the circuit board.

14. The sensor according to claim 13, wherein
the conductive beads are dispersed in the resin adhesive member without contacting the beads together.

15. The sensor according to claim 12, further comprising:
force applying means for applying a force to the package so that the bottom of the package is pressed to the top of the circuit board through the conductive member.

16. The sensor according to claim 15, wherein
the conductive member further includes a resin adhesive member,
the conductive beads are mixed in the resin adhesive member,
the resin adhesive member is capable of elastically connecting the package and the circuit board, and
the conductive beads are capable of electrically connecting the package and the circuit board.

17. An angular rate sensor comprising:
a circuit board;
a package including an angular rate sensor chip and a connection terminal; and
a conductive member, wherein
the angular rate sensor chip is accommodated in the package,
the package is disposed on the circuit board through the conductive member,
the package further includes a first electrode disposed on a bottom of the package, the first electrode connecting to the connection terminal,
the circuit board includes a second electrode disposed on a top of the circuit board, the angular rate sensor chip in the package is electrically connected to the circuit board through the connection terminal, the first and the second electrodes and the conductive member, the circuit board and the package are electrically and elastically connected by the conductive member, and the conductive member is uniformly spaced between the package and the circuit board.

18. An angular rate sensor comprising:

a circuit board;

a package including an angular rate sensor chip and a connection terminal; and a conductive member, wherein the angular rate sensor chip is accommodated in the package, the package is disposed on the circuit board through the conductive member, the package further includes a first electrode disposed on a bottom of the package, the first electrode connecting to the connection terminal, the circuit board includes a second electrode disposed on a top of the circuit board, the angular rate sensor chip in the package is electrically connected to the circuit board through the connection terminal, the first and the second electrodes and the conductive member, and the conductive member includes a plurality of conductive beads and a resin adhesive member, the conductive beads are disposed in the resin adhesive member, the resin adhesive member is capable of elastically connecting the package and the circuit board, and only one bead is disposed between the first and second electrodes in a vertical direction perpendicular to the circuit board.

* * * * *